(12) United States Patent
Hishiki et al.

(10) Patent No.: US 10,763,196 B1
(45) Date of Patent: Sep. 1, 2020

(54) LEAD FRAME

(71) Applicant: Ohkuchi Materials Co., Ltd., Isa, Kagoshima (JP)

(72) Inventors: Kaoru Hishiki, Isa (JP); Keiichi Otaki, Isa (JP); Hidehiko Sasaki, Isa (JP); Kotaro Tomeoka, Isa (JP)

(73) Assignee: OHKUCHI MATERIALS CO., LTD., Kagoshima (JP)

( * ) Notice: Subject to any disclaimer, the term of this patent is extended or adjusted under 35 U.S.C. 154(b) by 0 days.

(21) Appl. No.: 16/825,038

(22) Filed: Mar. 20, 2020

(30) Foreign Application Priority Data

Mar. 22, 2019 (JP) ................................ 2019-055683

(51) Int. Cl.
| | |
|---|---|
| *H01L 23/495* | (2006.01) |
| *H01L 21/48* | (2006.01) |
| *H01L 23/00* | (2006.01) |
| *H01L 21/56* | (2006.01) |
| *H01L 23/31* | (2006.01) |

(52) U.S. Cl.
CPC .... *H01L 23/49582* (2013.01); *H01L 21/4828* (2013.01); *H01L 21/56* (2013.01); *H01L 23/3121* (2013.01); *H01L 23/49541* (2013.01); *H01L 24/16* (2013.01); *H01L 24/32* (2013.01); *H01L 24/48* (2013.01); *H01L 24/73* (2013.01); *H01L 2224/16245* (2013.01); *H01L 2224/32245* (2013.01); *H01L 2224/48091* (2013.01); *H01L 2224/48106* (2013.01); *H01L 2224/48245* (2013.01); *H01L 2224/73265* (2013.01)

(58) Field of Classification Search
CPC ........... H01L 23/49582; H01L 21/4828; H01L 24/73; H01L 21/56; H01L 24/48; H01L 24/16; H01L 23/3121; H01L 24/32; H01L 23/49541; H01L 2224/32245; H01L 2224/48091; H01L 2224/73265; H01L 2224/48245; H01L 2224/16245; H01L 2224/48106

See application file for complete search history.

(56) References Cited

U.S. PATENT DOCUMENTS

| | | | | |
|---|---|---|---|---|
| 6,087,714 | A * | 7/2000 | Kubara | ............ H01L 23/49582 |
| | | | | 257/666 |
| 2002/0053721 | A1* | 5/2002 | Kubara | ............ H01L 23/49582 |
| | | | | 257/666 |

(Continued)

FOREIGN PATENT DOCUMENTS

| | | |
|---|---|---|
| JP | 3259894 B2 | 2/2002 |
| JP | 4853508 B2 | 1/2012 |
| JP | 5151438 B2 | 2/2013 |

*Primary Examiner* — Steven T Sawyer
(74) *Attorney, Agent, or Firm* — Westerman, Hattori, Daniels & Adrian, LLP

(57) ABSTRACT

A lead frame includes, as an outermost plating layer, a roughened silver plating layer having acicular projections and covering the entire surface of a lead frame substrate made of a copper-based material. The roughened silver plating layer has a crystal structure in which the crystal direction <101> occupies a largest proportion among the crystal directions <001>, <111>, and <101>. The lead frame can be manufactured with improved productivity owing to reduction in cost and operation time, and achieves remarkably high adhesion to sealing resin while keeping the total thickness of plating layers including the silver plating layer to be thin.

4 Claims, 8 Drawing Sheets

(56) References Cited

U.S. PATENT DOCUMENTS

| | | | |
|---|---|---|---|
| 2003/0082398 A1* | 5/2003 | Tanaka | C22C 13/00 428/647 |
| 2004/0108133 A1* | 6/2004 | Sano | H05K 3/325 174/260 |
| 2009/0212667 A1* | 8/2009 | Matsushita | H01L 41/41 310/360 |
| 2014/0252580 A1* | 9/2014 | Shin | C25D 17/00 257/676 |
| 2015/0137347 A1* | 5/2015 | Nakako | C08K 3/08 257/734 |
| 2016/0204003 A1* | 7/2016 | Kwan | C25D 5/18 205/103 |
| 2018/0053709 A1* | 2/2018 | Crema | H01L 21/4853 |

* cited by examiner

LEAD FRAME

CROSS-REFERENCE TO RELATED PATENT APPLICATIONS

This application claims the benefit of Japanese Patent Application No. 2019-055683 filed in Japan on Mar. 22, 2019, the contents of which are incorporated herein by reference.

BACKGROUND OF THE INVENTION

1) Field of the Invention

The present invention relates to a lead frame for a semiconductor in which silver plating, as outermost plating, is applied to the entire surface of a lead frame substrate.

2) Description of Related Art

One of devices for mounting a semiconductor element thereon is a lead frame. Conventionally, often used are lead frames in which silver plating, as outermost plating, is applied to the entirety or a part of the surface of a lead frame substrate. Silver or an alloy containing silver, however, has poor adhesion to a sealing resin. Therefore, such a lead frame involves a problem in reliability, for the sealing resin is easily peeled off the lead frame by shock or heat.

To solve this problem, there is known a technique in which the surface of the lead frame substrate is roughened to have concavities and convexities by microetching, to produce a physical anchor effect, thereby improving adhesion to sealing resin.

However, a lead frame substrate often used in manufacture of a lead frame is made of a copper alloy containing silicon, to generate impurity residue called smut if undergoing microetching process. For this reason, it is unsuitable to use the technique of roughening the surface of a lead frame substrate made of a copper alloy into a roughened state having concavities and convexities by microetching process.

Further, in the case of a lead frame using a lead frame substrate made of a copper alloy, it is necessary to minimize the influence of diffusion of copper, which exists in the underlying lead frame substrate made of a copper alloy, in order to secure good bondability with metal wires used at the time of bonding with a semiconductor element. Therefore, when a plating layer made of a precious metal or a precious metal alloy such as silver or an alloy containing silver is formed directly on a lead frame substrate made of a copper alloy without an undercoat layer being provided, it is generally necessary to make the thickness of the plating layer made of a precious metal or a precious metal alloy 2 μm or more.

On the other hand, in recent years, for cost reduction and size reduction of semiconductor packages, high-density packaging upon use of light, thin, short and small parts has been demanded. For size reduction, plating layers are required to be made thinner. Regarding plating layers made of precious metals or precious metal alloys, they are required to be made much thinner from the standpoint of cost reduction also.

In a lead frame using a lead frame substrate made of a copper alloy, one of the measures for reducing the thickness of a plating layer made of a precious metal or a precious metal alloy is to form, as an undercoat layer beneath the plating layer made of a precious metal or a precious metal alloy, a plating layer made of nickel or an alloy containing nickel, which prevents copper diffusion.

However, even if the plating layer made of a precious metal or a precious metal alloy is made thin, the adhesion to the resin cannot be improved.

As conventional art relating to these issues, Japanese Patent No. 3259894 discloses, with respect to an undercoat layer beneath the plating layer made of a precious metal or a precious metal alloy, the technique of forming a dense and planar nickel plating layer on the entire surface of a copper alloy and then forming thereon a nickel plating layer in which crystal growth in the vertical direction is given priority over crystal growth in the horizontal direction to form a top surface with concavities and convexities, thereby producing the physical anchor effect for improving adhesion with sealing resin.

Japanese Patent No. 4853508 discloses, with respect to an undercoat layer beneath the plating layer made of a precious metal or a precious metal alloy, the technique of forming, on a copper alloy, a nickel plating layer shaped to have conical projections and then forming thereon a nickel plating layer having good leveling property so that projections are shaped hemispherical, thereby improving adhesion to sealing resin and preventing seepage of epoxy resin component.

Japanese Patent No. 5151438 discloses the technique of forming, on a nickel layer having a rough surface, a noble metal plating layer composed of a gold layer and a silver layer.

The techniques disclosed by these patent documents are such that, for the purpose of improving adhesion to resin, an undercoat layer is formed to have a roughened surface and that a noble metal plating layer is made to laminate it as following the shape of the roughened surface. As another measure for improving adhesion to resin, it is conceivable to roughen the surface of a precious metal plating layer having being formed as a smooth precious metal plating layer on the surface of the lead frame substrate. For this purpose, it is necessary to form the smooth precious metal plating layer thickly before roughening its surface.

After repeated trial and error, the present inventors have found it possible to improve productivity by reducing cost and working time for forming a roughened surface, while keeping the total thickness of the plating layer to be thin as well as remarkably increasing adhesion to the sealing resin.

SUMMARY OF THE INVENTION

A lead frame according to embodiment modes of the present invention includes a lead frame substrate made of a copper-based material and a roughened silver plating layer having acicular projections, provided as an outermost plating layer and covering the entire surface of the lead frame substrate, wherein the roughened silver plating layer has a crystal structure in which the crystal direction <101> occupies a largest proportion among the crystal directions <001>, <111> and <101>.

According to the embodiment modes of the present invention, in a lead frame in which silver plating, as the outermost plating layer, is applied to the entire surface of the lead frame substrate, it is possible to stay the total thickness of plating layers including the silver plating layer to be small and to remarkably increase adhesion to the sealing resin, while reducing cost and working time, to improve productivity.

These and other features of the present invention will become apparent from the following detailed description of the preferred embodiments when taken in conjunction with the accompanying drawings.

BRIEF DESCRIPTION OF THE DRAWINGS

FIG. 1A is a plan view, FIG. 1B is an explanatory diagram schematically showing the A-A cross section in FIG. 1A, and FIG. 1C is a diagram that shows a modification of the lead frame of the first embodiment mode shown in FIGS. 1A-1B.

FIG. 5A is a plan view and FIG. 5B is an explanatory diagram schematically showing a B-B cross section in FIG. 5A.

DETAILED DESCRIPTION OF THE EMBODIMENTS

Figure 1A:
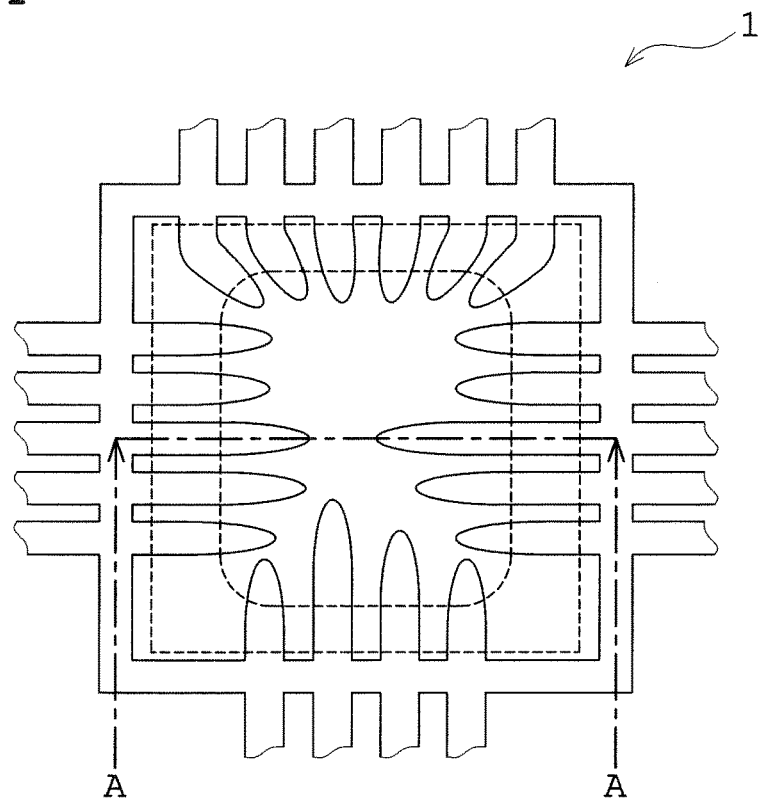
FIGS. 1A-1C are diagrams that show one example of a lead frame according to a first embodiment mode of the present invention, where

Preceding the description of the embodiment modes, the background leading to the derivation of the present invention and the operation and effect of the present invention will be described.

The inventors of the present invention considered that, in order to improve adhesion to sealing resin and to reduce the total thickness of plating layers while reducing cost and working time for forming a roughened outermost surface for improved productivity, it was necessary to form, either directly on the lead frame substrate or on a undercoat layer with a smooth surface provided on the lead frame substrate, a silver plating layer with a roughened surface not by roughening the surface of a smooth silver plating layer.

Then, in the process of trial and error, the inventors of the present invention have derived a lead frame in which a roughened silver plating layer with acicular projections formed not by roughening the surface of a smooth silver plating layer is provided as the outermost layer covering the entire surface of a lead frame substrate made of a copper-based material.

In the present application, the acicular projections included in the roughened silver plating layer are defined as an aggregate of a plurality of acicular projections having a surface area ratio (here, the ratio of the surface area of the roughened silver plating layer to the surface area of the corresponding smooth surface) of 1.30 or more and 6.00 or less.

It has been found that a roughened silver plating layer having acicular projections with such a surface area ratio would make sealing resin easily flow into the roots of the individual projections of the acicular projections, so that, when the sealing resin is cured, the large contact area and the intricate contour can enhance the physical anchor effect.

Further, as a result of repeated trial and error by the inventors, it has been found that a roughened silver plating layer having acicular projections could be formed by growing a crystal structure in which the proportion of a predetermined crystal direction is high as being different from a crystal structure of a conventional smooth silver plating layer or a roughened silver plating layer formed by roughening a surface of a smooth silver plating layer, and that the roughened surface having the acicular projections formed of the well-grown crystal structure would be effective in remarkably improving adhesion to sealing resin compared with a roughened surface formed by the conventional technique. In this way, the present invention has been introduced.

The lead frame of the embodiment modes of the present invention includes a lead frame substrate made of a copper-based material and a roughened silver plating layer having acicular projections, provided as an outermost plating layer and covering an entire surface of the lead frame substrate, wherein the roughened silver plating layer has a crystal structure in which the crystal direction <101> occupies a largest proportion among the crystal directions <001>, <111> and <101>.

As in the lead frame of the embodiment modes of the present invention, if a roughened silver plating layer has acicular projections having a surface area ratio of 1.30 or more and 6.00 or less (i.e. the ratio of the surface area of the roughened silver plating layer to the surface area of the corresponding smooth surface), sealing resin would easily flow into the roots of the individual acicular projections. Therefore, when the sealing resin is cured, the large contact area and the intricate contour can enhance the physical anchor effect, to achieve good adhesion. The directions in which the individual acicular projections extend are not uniform; not only the upward direction and oblique directions but also the shape of bent needles are included. If the individual acicular projections are randomly extended radially, the anchor effect on the sealing resin can be further enhanced.

In addition, as in the lead frame of the embodiment modes of the present invention, if a roughened silver plating layer with acicular projections provided as the outermost layer and covering the entire surface of a lead frame substrate made of a copper-based material is configured to have a crystal structure in which the crystal direction <101> occupies a largest proportion among the crystal directions <001>, <111> and <101>, such a roughened silver plating layer allows sealing resin to easily flow into its deeper portions and accordingly exerts higher adhesion to the sealing resin than other roughened silver plating layers such as those having roughened surfaces with a surface area ratio (i.e. the ratio of the surface area of the silver plating layer to the surface area of the corresponding smooth surface) of less than 1.30 and those formed by roughening the surface of a smooth silver plating layer having the conventional crystal structure, which is different from the crystal structure in which the crystal direction <101> occupies a largest proportion among the crystal directions <001>, <111> and <101>.

Further, according to the lead frame of the embodiment modes of the present invention, at a semiconductor element mounting portion, on which a semiconductor element is to be mounted, and internal connection terminal portions, which are to be electrically connected to the semiconductor element directly or via a wire, on the upper surface side, and at external connection terminal portions, which are to be electrically connected to an external device, on the lower surface side, the contact area with the connection member such as solder or paste is increased by the acicular projections of the roughened silver plating layer, whereby seepage of moisture can be prevented, the strain caused by thermal expansion is prevented, and delamination between the connection member and the plating film is prevented.

The roughened silver plating layer having acicular projections with a crystal structure in which the crystal direction <101> occupies a largest proportion among the crystal directions <001>, <111> and <101> according to the embodiment modes of the present invention can be formed by use of the lead frame substrate as a base.

In addition, according to the lead frame of the embodiment modes of the present invention, adhesion to the sealing resin can be remarkably improved by the roughened silver plating layer having acicular projections with a crystal structure in which the crystal direction <101> occupies a largest proportion among the crystal directions <001>, <111> and <101>. Accordingly, in the case where a barrier plating layer is needed to be formed as an undercoat layer for preventing copper constituting the material of the lead frame substrate from diffusing under a high temperature environment, forming a thin and smooth barrier plating layer having a sufficient thickness for preventing diffusion of the base copper serves the purpose; it is not necessary to form a barrier plating layer with a roughened surface.

The roughened silver plating layer having acicular projections with a crystal structure in which the crystal direction <101> occupies a largest proportion among the crystal directions <001>, <111> and <101> can be formed by silver plating under the conditions described later, without roughening the surface of a smooth silver plating layer.

Therefore, by employing the lead frame of the embodiment modes of the present invention, it is possible to minimize the processing cost of the roughened surface for improved adhesion with resin, and to minimize the total thickness of the plating layers.

Further, in the lead frame of the embodiment modes of the present invention, preferably, the average diameter of crystal grains in the roughened silver plating layer is smaller than 0.28 μm.

If the average diameter of crystal grains in the roughened silver plating layer is 0.28 μm or greater, after crystals for silver plating grow in the height direction, spaces between the crystals come to be wide and thus the surface area ratio (i.e. the ratio of the surface area of the roughened silver plating layer to the surface area of the corresponding smooth surface) fails to be within the range of 1.30 to 6.00.

If the average diameter of crystal grains in the roughened silver plating layer is smaller than 0.28 μm, after crystals for silver plating grow in the height direction, spaces between the crystals comes to be narrow and thus the surface area ratio (i.e. the ratio of the surface area of the roughened silver plating layer to the surface area of the corresponding smooth surface) can be within the range of 1.30 to 6.00. More preferably, the roughened silver plating layer has crystal grains with an average diameter of 0.15 μm or more and 0.25 μm or less.

In the lead frame of the embodiment modes of the present invention, an undercoat layer may be provided between the lead frame substrate and the roughened silver plating layer.

It is preferable that the shape of the acicular projections included in the roughened silver plating layer in the lead frame of the embodiment modes of the present invention is determined only by the roughened silver plating layer itself without being affected by the surface shape of the base thereunder. The surface state of the base may be smooth or roughened. In consideration of costs such as productivity, it is preferable that the base is prepared only by activation treatment on the surface of the lead frame substrate, on which a roughened silver plating layer is to be formed. In the case where the influence of diffusion of copper, which forms the material of the lead frame substrate, under a high temperature environment should be taken into consideration, it is preferable to provide a smooth undercoat layer as a barrier plating layer between the lead frame substrate and the roughened silver plating layer. In this case, since it suffices to form the plating layer thinly and smoothly to a thickness as to prevent diffusion of the base copper, a thin undercoat layer is preferable.

According to the lead frame of the embodiment modes of the present invention, in the case where silver plating layers including a roughened silver plating layer are directly formed on the entire surface of the lead frame substrate without an undercoat layer between, the total thickness of the plating layers provided on the entire surface of the lead frame substrate is preferably 0.4 μm or more and 6.0 μm or less. To be specific, it is preferable to form, on the entire surface of the lead frame substrate, a silver strike plating layer with a thickness of 0.2 μm or more and 3.0 μm or less, more preferably 1.5 μm, and thereon to laminate a roughened silver plating layer having acicular projections with a thickness of 0.2 μm or more and 3.0 μm or less, more preferably 0.5 μm.

In the case where a nickel plating layer is provided as the undercoat barrier plating layer, it is preferable that the thickness of the nickel plating layer provided on the entire surface of the lead frame substrate be 0.3 μm or more and 3.0 μm or less. To be specific, it is preferable to form, on the entire surface of the lead frame substrate, a nickel plating layer with a thickness of 0.3 μm or more and 3.0 μm or less, preferably 1.0 μm, and thereon to laminate a roughened silver plating layer having acicular projections with a thickness of 0.2 μm or more and 3.0 μm or less, preferably 0.5 μm.

In the case where a palladium plating layer is provided between the undercoat nickel plating layer and the roughened silver plating layer, the thickness of the palladium plating layer is preferably 0.005 μm or more and 0.1 μm or less. To be specific, it is preferable to form a palladium plating layer with a thickness of 0.005 μm or more and 0.1 μm or less, preferably 0.01 μm, on the nickel plating layer formed on the entire surface of the lead frame substrate.

Further, in the case where a gold plating layer is provided between the two undercoat layers, which consist of the nickel plating layer and the palladium plating layer, and the roughened silver plating layer, the thickness of the gold plating layer is preferably 0.0005 μm or more and 0.01 μm or less. To be specific, it is preferable to form a gold plating layer of 0.0005 μm or more and 0.01 μm or less, preferably 0.001 µm on the nickel plating layer and the palladium plating layer formed on the entire surface of the lead frame substrate.

The roughened silver plating layer having acicular projections with a crystal structure in which the crystal direction <101> occupies a largest proportion among the crystal directions <001>, <111> and <101> in the lead frame of the embodiment modes of the present invention can be obtained by plating upon use of a silver plating bath having a silver concentration of 1.0 g/L to 10 g/L, which is a methanesulfonic acid-based silver plating solution, for 5 to 60 seconds at a temperature of 55° C. to 65° C. and a current density of 3 A/dm$^2$ to 20 A/dm$^2$.

Therefore, according to the embodiment modes of the present invention, it is possible to manufacture a lead frame in which silver plating, as plating of the outermost layer, is applied to the entire surface of the lead frame substrate upon staying the total thickness of plating layers including the silver plating layer to be small and remarkably increasing adhesion to the sealing resin while reducing cost and working time for forming the outermost, roughened surface, to improve productivity.

Hereinafter, lead frames to which the embodiment modes of the present invention are applied and a manufacturing method therefor will be described. The present invention is not limited to the following detailed description unless otherwise specifically limited.

First Embodiment Mode

Figure 1B:
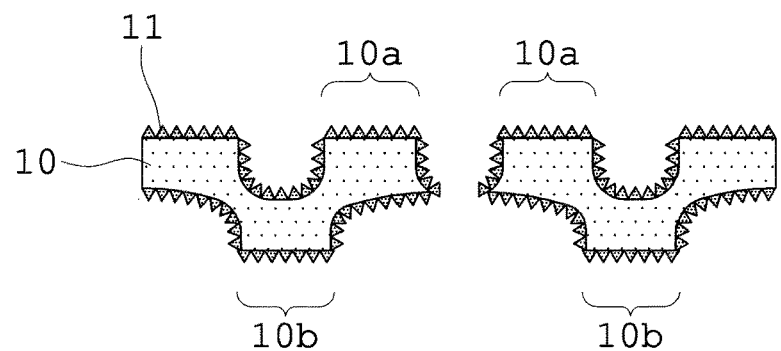
Figure 1C:
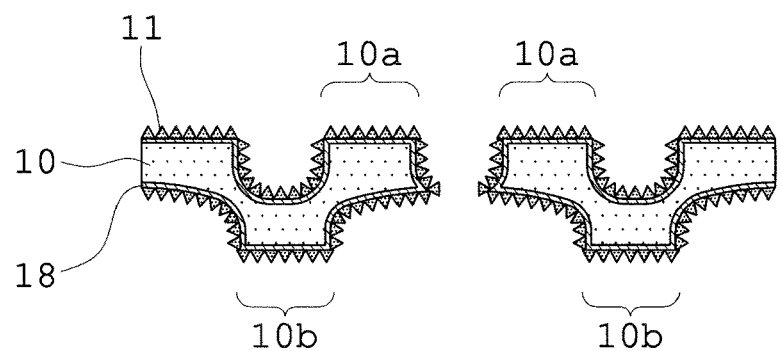
Figure 2:
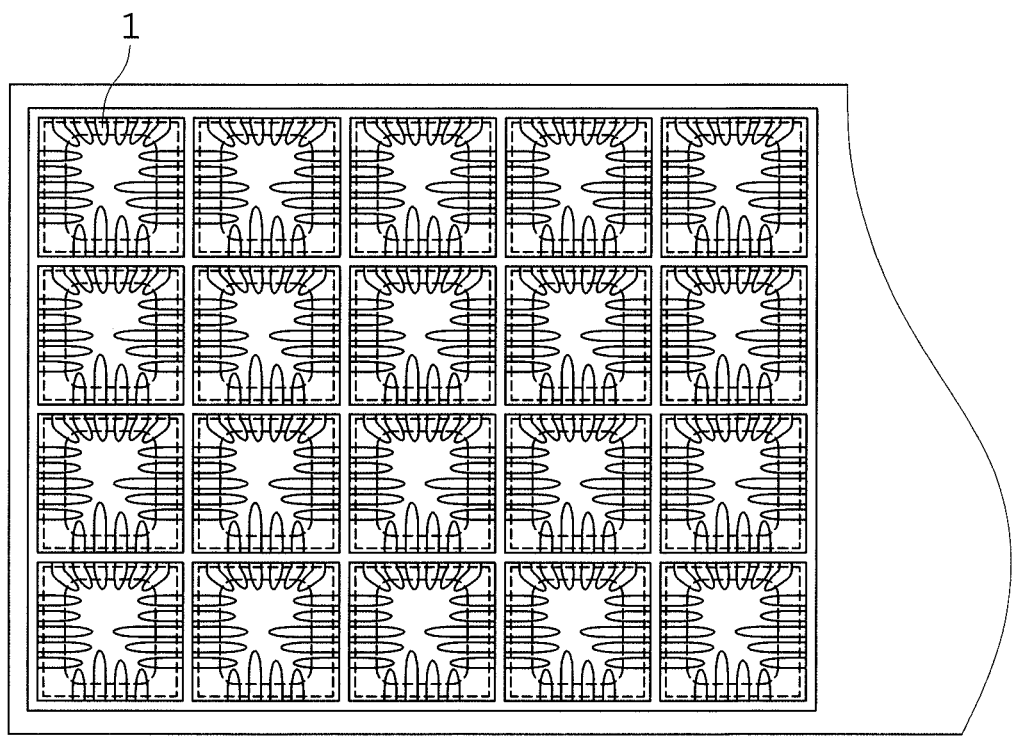
FIG. 2 is a plan view that shows one example of lead frames arrayed in multiple rows according to the first embodiment mode of the present invention.

FIGS. 1A-1B are diagrams that show one example of a lead frame according to a first embodiment mode of the present invention, where FIG. 1A is a plan view and FIG. 1B is an explanatory diagram schematically showing the A-A cross section in FIG. 1A. FIG. 1C is a diagram that shows a modification of the lead frame of the first embodiment mode shown in FIGS. 1A-1B. FIG. 2 is a plan view that shows one example of lead frames arrayed in multiple rows according to the first embodiment mode of the present invention. FIGS. 3A-3F are explanatory diagrams that show an exemplary manufacturing procedure of a lead frame for mounting a semiconductor element thereon according to the first embodiment mode of the present invention. FIGS. 4A-4E are explanatory diagrams that show an exemplary manufacturing procedure of a semiconductor package using the lead frame for mounting a semiconductor element thereon according to the first embodiment mode of the present invention.

As shown in FIG. 1A, a lead frame 1 of this embodiment mode includes a plurality of terminals extending from four sides toward a site on which a semiconductor element is to be mounted. As shown in FIG. 1B, a roughened silver plating layer 11 is provided as an outermost plating layer covering the entire surface of a lead frame substrate 10 made of a copper-based material. In FIG. 1B, the reference numeral 10a denotes an internal connection terminal portion to be electrically connected to the semiconductor element, and the reference numeral 10b denotes an external connection terminal portion.

The roughened silver plating layer 11 has acicular projections having a surface area ratio of 1.30 or more and 6.00 or less (i.e. the ratio of the surface area of the roughened silver plating layer to the surface area of the corresponding smooth surface).

The roughened silver plating layer 11 has a crystal structure in which the crystal direction <101> occupies a largest proportion among the crystal directions <001>, <111> and <101>.

The average diameter of crystal grains in the roughened silver plating layer 11 is smaller than 0.28 µm.

In this embodiment mode, the roughened silver plating layer 11 is formed to have a thickness of 0.2 µm or more and 3.0 µm or less upon use the lead frame substrate 10 made of a copper-based material as a base.

As a modification of this embodiment mode, between the lead frame substrate 10 made of a copper-based material and the roughened silver plating layer 11, an undercoat layer may be provided, to function as a barrier plating layer for preventing copper from diffusing under a high temperature. In this case, the undercoat layer 18 as shown in FIG. 1C can be composed of any of a nickel plating layer, nickel/palladium plating layers and nickel/palladium/gold plating layers, and the roughened silver plating layer 11 is preferably formed to have a thickness of 0.2 µm or more and 3.0 µm or less.

To be specific, in an exemplary case where an undercoat layer, which functions as a barrier plating layer for preventing diffusion of copper when electrical connection with a semiconductor element is made via solder, is composed of nickel/palladium plating layers or nickel/palladium/gold plating layers, the roughened silver plating layer 11 is preferably formed to have a thickness of 0.2 µm or more and 3.0 µm or less.

The lead frame 1 of this embodiment mode is configured so that, as shown in FIG. 2, the individual lead frames 1 are arrayed in multiple rows.

Next, an exemplary manufacturing procedure of the lead frame 1 of this embodiment mode will be described in reference to FIGS. 3A-3F.

Figure 3A:
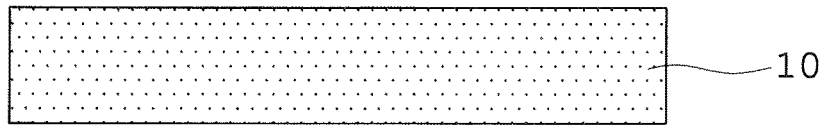
FIGS. 3A-3F are explanatory diagrams that show an exemplary manufacturing procedure for a lead frame for mounting a semiconductor element thereon according to the first embodiment mode of the present invention.

First, a metal plate 10 made of a copper-based material is prepared as a lead frame substrate (See FIG. 3A).

Figure 3B:
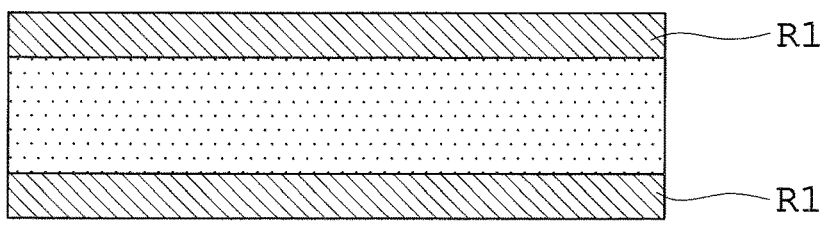

Then, resist layers R1 are formed on both surfaces of the metal plate 10 (See FIG. 3B).

Figure 3C:
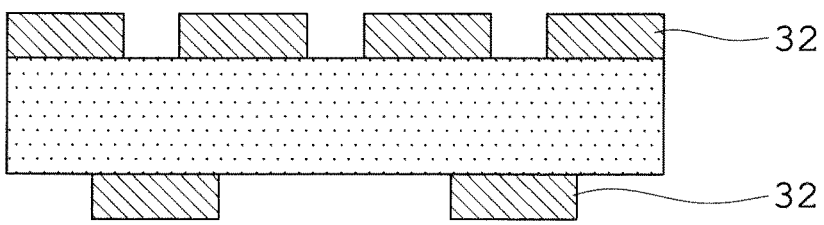

Then, exposure and development are performed upon use of glass masks carrying a pattern corresponding to a predetermined lead frame shape, to form etching resist masks 32 (See FIG. 3C).

Figure 3D:
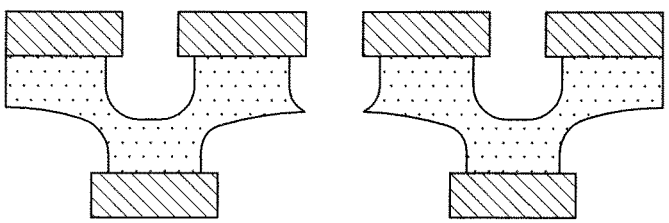

Then, etching is performed on both sides, to form the predetermined lead frame shape (See FIG. 3D).

Figure 3E:
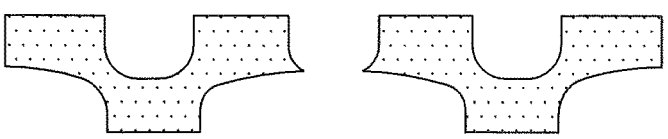

Then, the etching resist masks 32 are removed (See FIG. 3E).

Figure 3F:
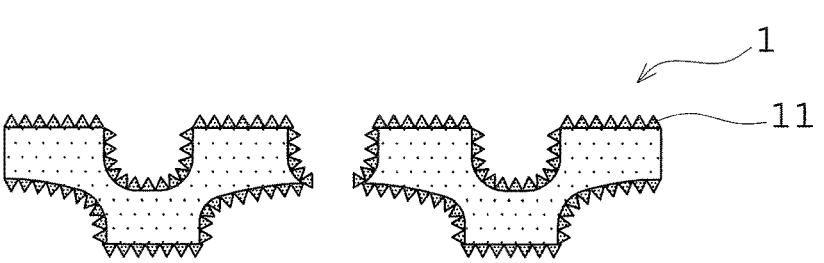

Then, a roughened silver plating layer 11 having acicular projections is formed as an outermost plating layer covering the entire surface of the metal plate 10 having been shaped into the predetermined lead frame shape (See FIG. 3F).

Thereby, the lead frame 1 of this embodiment mode is completed.

Regarding the process of forming the roughened silver plating layer 11 having acicular projections as the outermost layer, the roughened silver plating layer is directly formed on the lead frame substrate 10 only upon activation treatment of the surface of the lead frame substrate 10 or is formed on a thin and smooth nickel plating layer formed as a barrier plating layer to a thickness as to prevent diffusion of the underlying copper. In the case where adhesiveness of the roughened silver plating layer 11 is unreliable, a silver strike plating layer may be formed directly before roughened silver plating, so that the roughened silver plating layer 11 is formed thereon.

In order to form the roughened silver plating layer 11 having acicular projections with a surface area ratio (i.e. the ratio of the surface area of the roughened silver plating layer to the surface area of a corresponding smooth surface) of 1.30 or more and 6.00 or less and with a crystal structure in which the crystal direction <101> occupies a largest proportion among the crystal directions <001>, <111> and <101>, the silver concentration in a silver plating bath composed of a methanesulfonic acid-based silver plating solution is set to 1.0 g/L or more and 10 g/L or less. In particular, it is much preferable that the silver concentration is in the range of 1.5 g/L or more and 5.0 g/L or less.

A silver concentration lower than 1.0 g/L is not preferable because the roughened silver plating film cannot be formed sufficiently. A silver concentration higher than 10 g/L causes the film of the roughened silver plating layer to have a smooth surface, or fails to form acicular silver crystals, and thus is not preferable.

As an alternative to the silver strike plating used to improve bondability between the base and the roughened silver plating layer 11, a plating layer of palladium or of an alloy containing palladium may be used to suitably bond the base and the roughened silver plating layer 11.

Further, a plating layer of gold or of an alloy containing gold may be formed under the roughened silver plating layer 11 in order to improve bondability to a semiconductor element.

In the case where the roughened silver plating layer 11 is formed directly on the lead frame substrate without an undercoat layer between, the thickness of the roughened silver plating layer 11 needs to be 0.2 µm or more, and is preferably 0.2 µm or more and 3.0 µm or less. Further, from the viewpoint of cost, it is much preferable that the thickness is 0.3 µm or more and 1.0 µm or less.

In the case where plating layers made of nickel/palladium plating or plating layers made of nickel/palladium/gold plating are provided as undercoat layers functioning as a barrier for preventing copper diffusion when electrical connection with a semiconductor element is made via solder, the thickness of the roughened silver plating layer 11 is preferably 0.2 µm or more and 3.0 µm or less.

Next, an exemplary manufacturing procedure for a semiconductor package using the lead frame 1 of this embodiment mode will be described in reference to FIGS. 4A-4E.

Figure 4A:
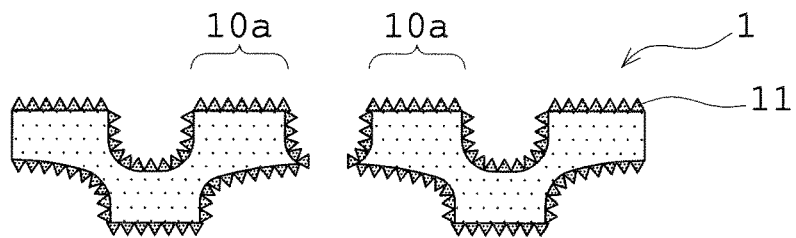
FIGS. 4A-4E are explanatory diagrams that show an exemplary manufacturing procedure for a semiconductor package using the lead frame for mounting a semiconductor element thereon according to the first embodiment mode of the present invention.

First, the lead frame 1 manufactured in accordance with the manufacturing procedure shown in FIGS. 3A-3F is prepared (See FIG. 4A).

Figure 4B:
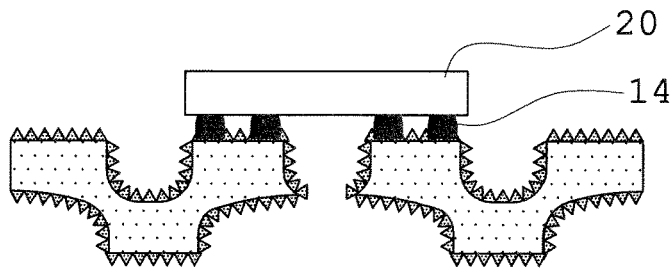

Then, solder 14 is printed on a semiconductor element mounting site in the internal connection terminal portions 10a on the upper surface side of the lead frame 1, and a semiconductor element 20 is mounted thereon and fixed, so that electrodes of the semiconductor element 20 and the internal connection terminal portions 10a of the lead frame 1 are electrically connected (See FIG. 4B).

Figure 4C:
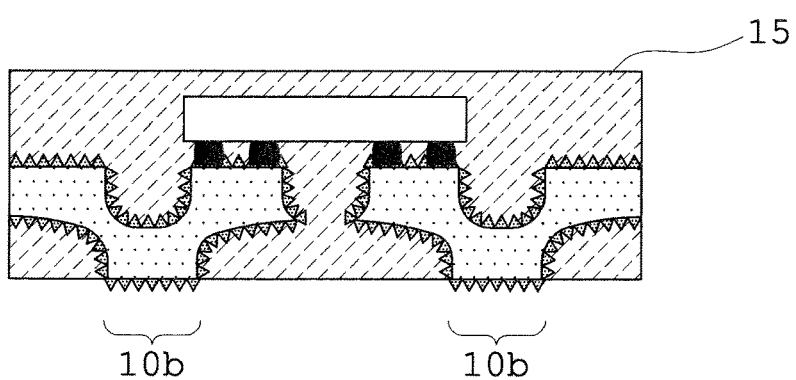

Then, a mold is used to seal, with sealing resin 15, a surrounding space region except the external connection terminal portions 10b on the lower surface side of the lead frame 1 (See FIG. 4C).

Figure 4D:
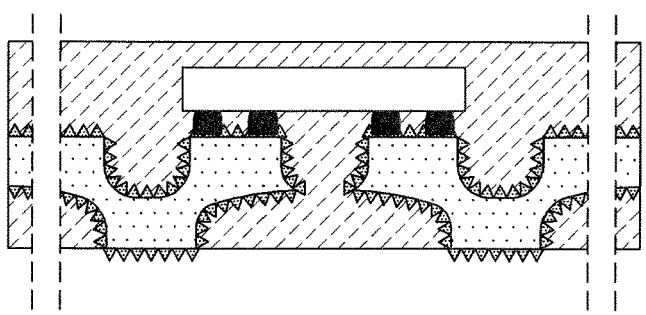

Lastly, semiconductor packages arrayed in multiple rows are singulated by dicing, pressing or the like (See FIG. 4D).

Figure 4E:
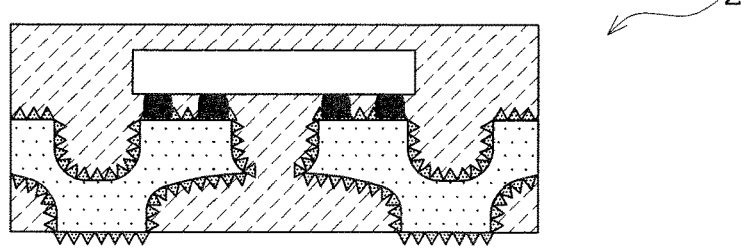

Thereby, a semiconductor package 2 using the lead frame 1 of this embodiment mode is obtained (See FIG. 4E).

Second Embodiment Mode

Figure 5A:
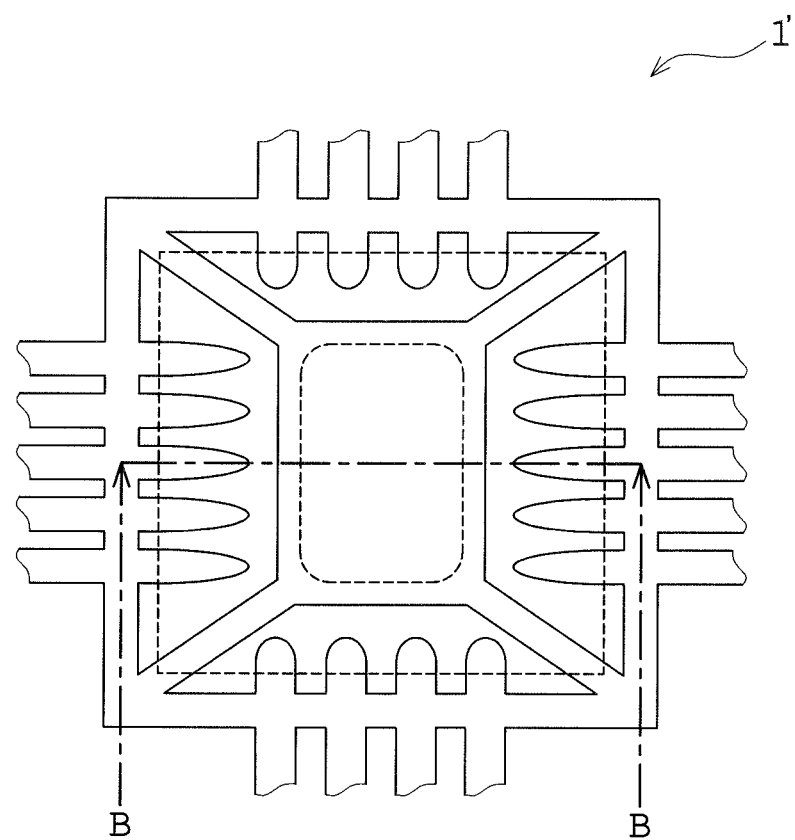
FIGS. 5A-5B are diagrams that show one example of a lead frame according to a second embodiment mode of the present invention, where
Figure 5B:
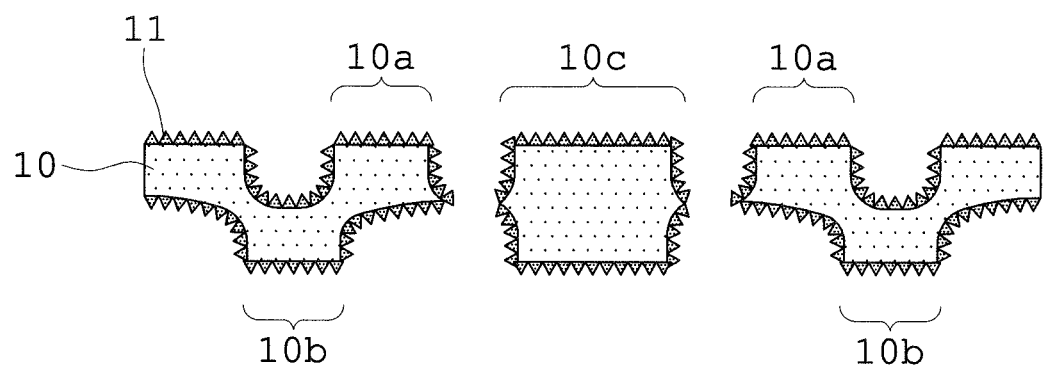
Figure 6:
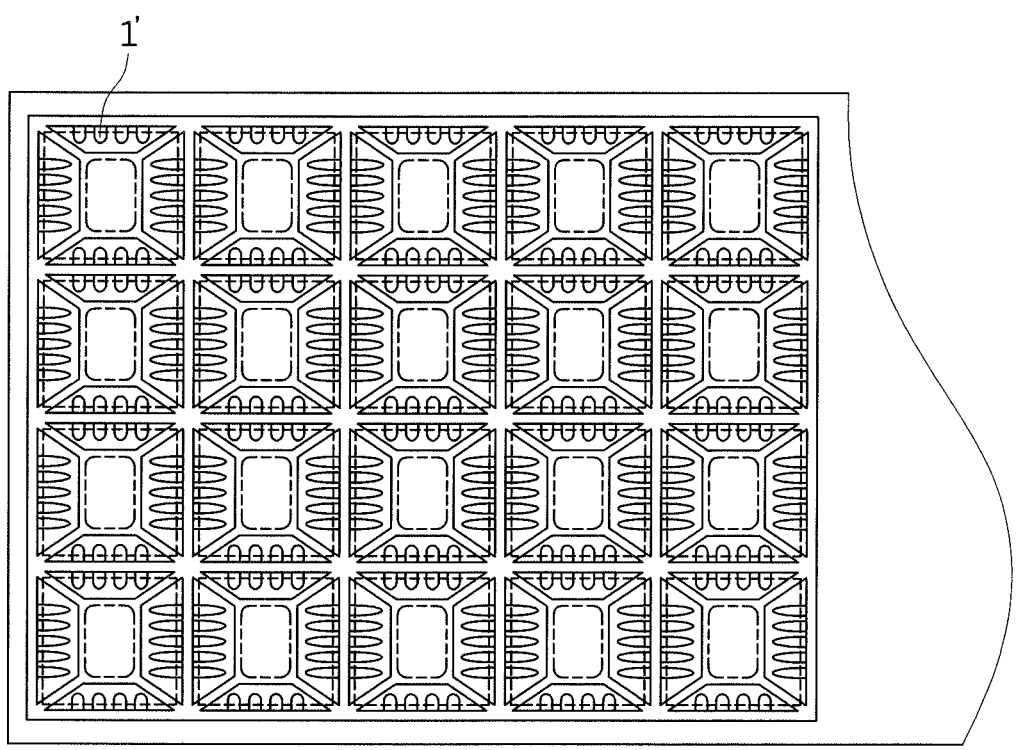
FIG. 6 is a plan view that shows one example of lead frames arrayed in multiple rows according to the second embodiment mode of the present invention.
Figure 7A:
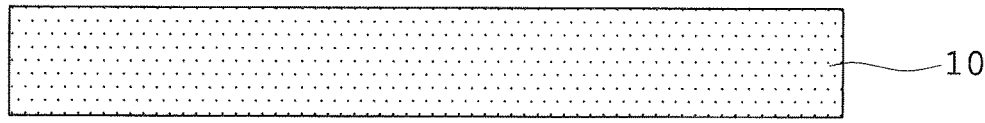
FIGS. 7A-7F are explanatory diagrams that show an exemplary manufacturing procedure for a lead frame for mounting a semiconductor element thereon according to the second embodiment mode of the present invention.
Figure 7B:
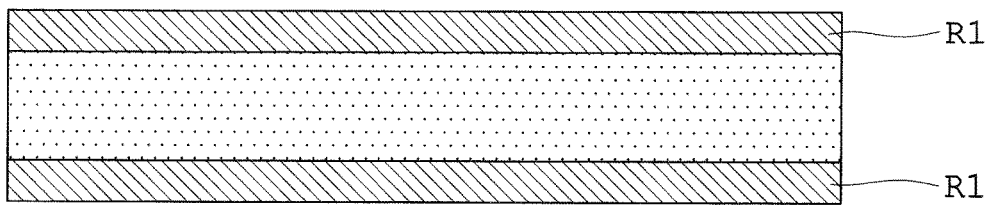
Figure 7C:
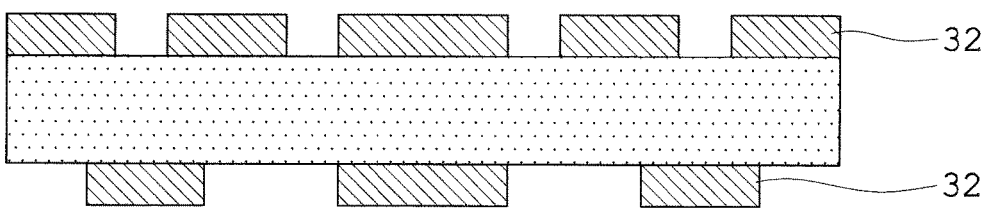
Figure 7D:
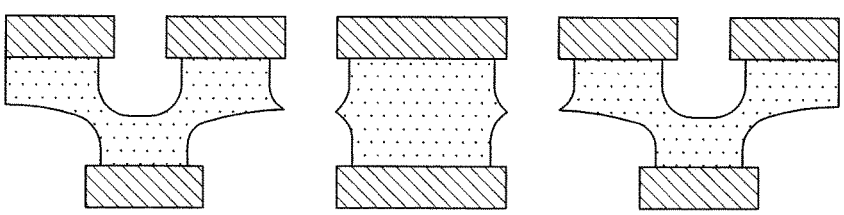
Figure 7E:
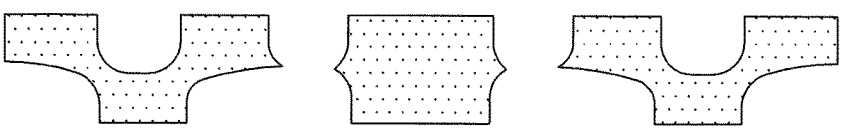
Figure 7F:
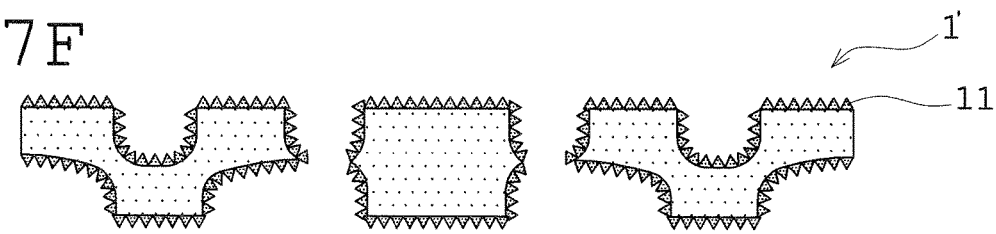

FIGS. 5A-5B are diagrams that show one example of a lead frame according to a second embodiment mode of the present invention, where FIG. 5A is a plan view and FIG. 5B is an explanatory diagram schematically showing a B-B cross section in FIG. 5A. FIG. 6 is a plan view that shows one example of lead frames arrayed in multiple rows according to the second embodiment mode of the present invention. FIGS. 7A-7F are explanatory diagrams that show an exemplary manufacturing procedure for a lead frame for mounting a semiconductor element thereon according to the second embodiment mode of the present invention. FIGS. 8A-8E are explanatory diagrams that show an exemplary manufacturing procedure for a semiconductor package using the lead frame for mounting a semiconductor element thereon according to the second embodiment mode of the present invention.

As shown in FIGS. 5A-5B, a lead frame 1' of this embodiment mode includes a pad portion 10c for mounting a semiconductor element thereon and a plurality of terminals extending from four sides toward the pad portion 10c, and, as shown in FIG. 5B, a roughened silver plating layer 11 is provided as an outermost plating layer covering the entire surface of a lead frame substrate 10 made of a copper-based material. In FIG. 5B, the reference numeral 10a denotes an internal connection terminal portion to be electrically connected to the semiconductor element, and the reference numeral 10b denotes an external connection terminal portion.

The roughened silver plating layer 11 has acicular projections having a surface area ratio (i.e. the ratio of the surface area of the roughened silver plating layer to the surface area of a corresponding smooth surface) of 1.30 or more and 6.00 or less.

The roughened silver plating layer 11 has a crystal structure in which the crystal direction <101> occupies a highest proportion among the crystal directions <001>, <111> and <101>.

The average diameter of crystal grains in the roughened silver plating layer 11 is smaller than 0.28 µm.

In this embodiment mode, the roughened silver plating layer 11 is formed to have a thickness of 0.2 µm or more and 3.0 µm or less upon use the lead frame substrate 10 made of a copper-based material as a base.

As a modification of this embodiment mode, between the lead frame substrate 10 made of a copper-based material and the roughened silver plating layer 11, an undercoat layer may be provided, to function as a barrier plating layer for preventing copper from diffusing under a high temperature. In this case, the undercoat layer can be composed of any of a nickel plating layer, nickel/palladium plating layers and nickel/palladium/gold plating layers, and the roughened silver plating layer 11 is preferably formed to have a thickness of 0.2 µm or more and 3.0 µm or less.

To be specific, in an exemplary case where an undercoat layer, which functions as a barrier plating layer for preventing diffusion of copper when electrical connection with a semiconductor element is made by wire bonding, is composed of a nickel plating layer, the roughened silver plating layer 11 is preferably formed to have a thickness of 0.2 µm or more and 3.0 µm or less.

Also, in an exemplary case where an undercoat layer, which functions as a barrier plating layer for preventing diffusion of copper when electrical connection with a semiconductor element is made by wire bonding, is composed of nickel/palladium plating layers, the roughened silver plating layer 11 is preferably formed to have a thickness of 0.2 µm or more and 3.0 µm or less.

The lead frame 1' of this embodiment mode is configured so that, as shown in FIG. 6, the individual lead frames 1 are arrayed in multiple rows.

Next, an exemplary manufacturing procedure of the lead frame 1' of this embodiment mode will be described in reference to FIGS. 7A-7F.

The manufacturing procedure of the lead frame 1' of this embodiment mode is substantially the same as the manufacturing procedure of the lead frame 1 of the first embodiment mode shown in FIGS. 3A-3F, and the process of forming the roughened silver plating layer 11 having acicular projections as an outermost plating layer is also substantially the same as that in the lead frame 1 of the first embodiment mode (See FIGS. 7A-7F).

In the case where the roughened silver plating layer 11 is formed directly on the lead frame substrate without an undercoat layer between, the thickness of the roughened silver plating layer 11 needs to be 0.2 µm or more, and is preferably 0.2 µm or more and 3.0 µm or less. Further, from the viewpoint of cost, it is much preferable that the thickness is 0.3 µm or more and 1.0 µm or less.

In the case where a nickel plating layer is provided as an undercoat layer functioning as a barrier for preventing copper diffusion when electrical connection with a semiconductor element is made by wire bonding, the thickness of the roughened silver plating layer 11 is preferably 0.2 µm or more and 3.0 µm or less.

In the case where nickel/palladium plating layers are provided as undercoat layers functioning as a barrier for preventing copper diffusion when electrical connection with a semiconductor element is made by wire bonding, the thickness of the roughened silver plating layer 11 is preferably 0.2 µm or more and 3.0 µm or less.

Next, an exemplary manufacturing procedure for a semiconductor package using the lead frame 1' of this embodiment mode will be described in reference to FIGS. 8A-8E.

Figure 8A:
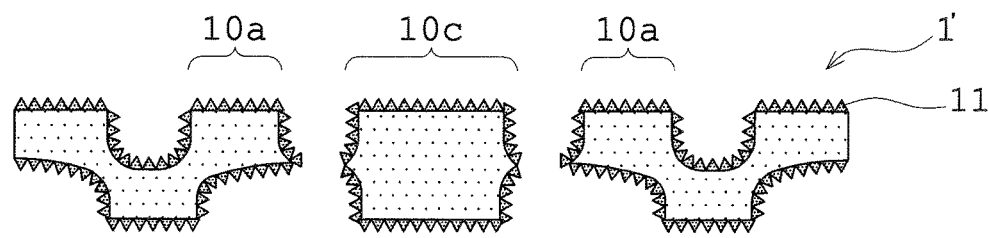
FIGS. 8A-8E are explanatory diagrams that show an exemplary manufacturing procedure for a semiconductor package using the lead frame for mounting a semiconductor element thereon according to the second embodiment mode of the present invention.

First, the lead frame 1' manufactured in accordance with the manufacturing procedure shown in FIGS. 7A-7F is prepared (See FIG. 8A).

Figure 8B:
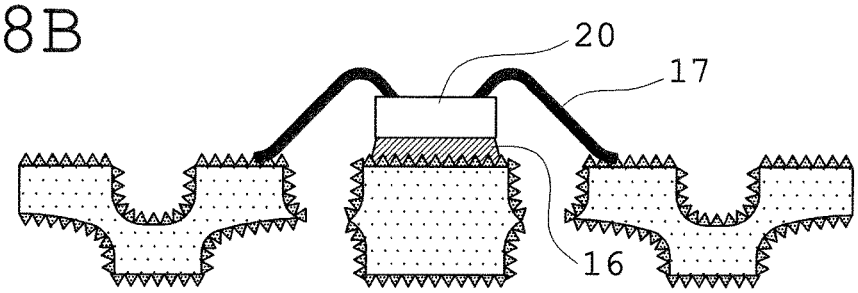
Figure 8C:
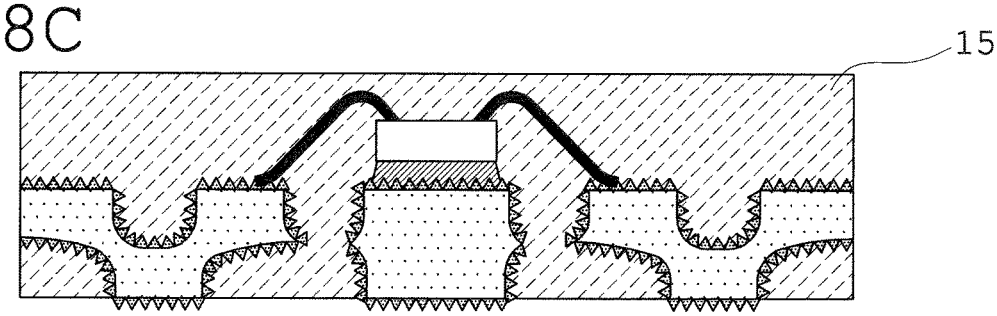

Then, a semiconductor element 20 is mounted and fixed on the pad portion 10c on the upper surface side of the lead frame 1' via a die bond 16, and electrodes of the semiconductor element 20 and the internal connection terminal portions 10a of the lead frame 1' are electrically connected via bonding wires 17 (See FIG. 8B).

Then, a mold is used to seal, with sealing resin 15, a surrounding space region except the external connection terminal portions 10b on the lower surface side of the lead frame 1' (See FIG. 4C).

Figure 8D:
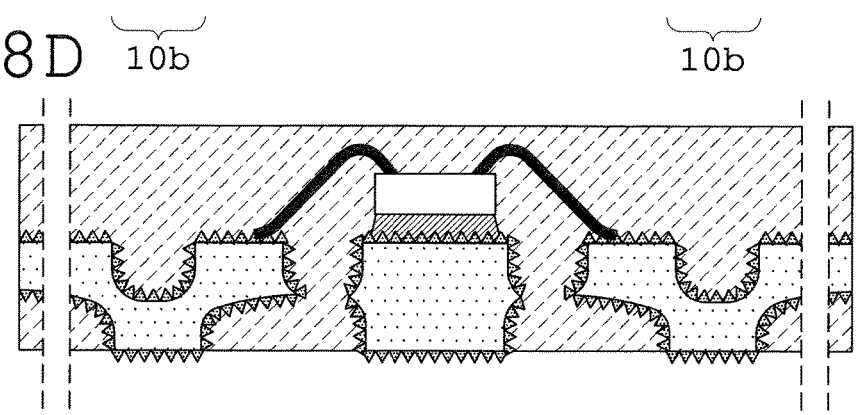

Lastly, semiconductor packages arrayed in multiple rows are singulated by dicing, pressing or the like (See FIG. 8D).

Figure 8E:
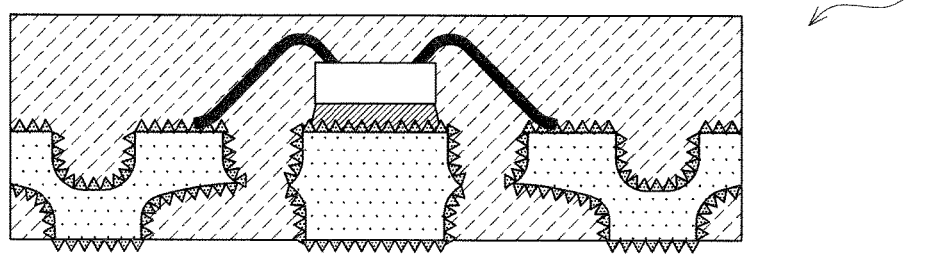

Thereby, a semiconductor package 2' using the lead frame 1' of this embodiment mode is obtained (See FIG. 8E).

Embodied Example 1

A lead frame of Embodied Example 1 is an exemplary lead frame in which the roughened silver plating layer 11 is formed directly on the entire surface of the lead frame substrate 10 without an undercoat layer between.

In Embodied Example 1, a strip copper material having a thickness of 0.2 mm and a width of 180 mm was prepared as the lead frame substrate 10 (See FIG. 3A). Resist layers R1 with a thickness of 25 µm were formed on both surfaces of the copper material (See FIG. 3B) and was developed after exposure upon use of glass masks carrying predetermined patterns, to form etching resist masks 32 (See FIG. 3C). Then, etching treatment was made (See FIG. 3D) and the etching resist mask 32 were removed, to form a lead frame having a predetermined shape (See FIG. 3E).

The entire surface of the metal plate 10, which had been shaped into the predetermined lead frame shape, was subjected to pretreatment with alkali and acid, and then was electroplated in the following manner.

By use of a silver plating bath with a silver concentration of 3.5 g/L, which was composed of a methanesulfonic acid-based silver plating solution, plating was performed for 45 seconds at a current density of 5 A/dm$^2$ and at a temperature of 60° C., to form a roughened silver plating layer 11 with a thickness of about 1.5 µm (See FIG. 3F) having acicular projections and having values shown in Table 1 regarding surface area ratio (i.e. the ratio of the surface area of the roughened silver plating layer to the surface area of a corresponding smooth surface), proportions of crystal directions <001>, <111> and <101>, and crystal grain diameter (average value), and thereby a lead frame 1 of Embodied Example 1 was completed.

Embodied Example 2

A lead frame of Embodied Example 2 is an exemplary lead frame having a structure in which, in consideration of electrical connection to a semiconductor element being made by wire bonding (gold wire or copper wire), a nickel plating layer is applied to the entire surface of the lead frame substrate 10 as an undercoat barrier plating layer for preventing thermal diffusion of copper residing in the lead frame substrate 10.

In Embodied Example 2, up to formation of a lead frame shape (See FIGS. 7A-7E) through pretreatment for electroplating, steps were carried out substantially in the same manner as in Embodied Example 1. In the subsequent electroplating treatment, first, by use of a nickel plating bath composed of nickel sulfamate, nickel chloride and boric acid, plating was performed for 1 minute and 30 seconds at a current density of 2 A/dm$^2$, to form a nickel plating layer as a smooth undercoat having a thickness of about 1.0 µm. Then, by use of a silver plating bath with a silver concentration of 3.5 g/L, which was composed of a methanesulfonic acid-based silver plating solution, plating was performed for 15 seconds at a current density of 5 A/dm$^2$ and at a temperature of 60° C., to form a roughened silver plating layer 11 with a thickness of about 0.5 µm (See FIG. 7F) having acicular projections and having values shown in Table 1 regarding surface area ratio (i.e. the ratio of the surface area of the roughened silver plating layer to the surface area of a corresponding smooth surface), proportions of crystal directions <001>, <111> and <101>, and crystal grain diameter (average value), and thereby a lead frame 1' of Embodied Example 2 was completed.

Embodied Example 3

A lead frame of Embodied Example 3 is an exemplary lead frame having a structure in which, in consideration of electrical connection to a semiconductor element being made by wire bonding (gold wire or copper wire) as in the lead frame of Embodied Example 2, a nickel plating layer and a palladium plating layer are made to laminate the entire surface of the lead frame substrate 10 as undercoat barrier plating layers for preventing thermal diffusion of copper residing in the lead frame substrate 10.

In Embodied Example 3, up to formation of a lead frame shape (See FIGS. 7A-7E) through formation of a nickel plating layer by electroplating treatment, steps were carried out substantially in the same manner as in Embodied Example 2. Then, by use of a palladium plating bath composed of a dichloroamine-based palladium plating solution, plating was performed for 10 seconds at a current density of 2 A/dm², to form a palladium plating layer as a smooth undercoat having a thickness of about 0.01 μm. Then, by use of a silver plating bath with a silver concentration of 3.5 g/L, which was composed of a methanesulfonic acid-based silver plating solution, plating was performed for 15 seconds at a current density of 5 A/dm² and at a temperature of 60° C., to form a roughened silver plating layer 11 with a thickness of about 0.6 μm (See FIG. 7F) having acicular projections and having values shown in Table 1 regarding surface area ratio (i.e. the ratio of the surface area of the roughened silver plating layer to the surface area of a corresponding smooth surface), proportions of crystal directions <001>, <111> and <101>, and crystal grain diameter (average value), and thereby a lead frame 1' of Embodied Example 3 was completed.

Embodied Example 4

A lead frame of Embodied Example 4 is an exemplary lead frame having a structure in which, in consideration of electrical connection to a semiconductor element being made via solder, a silver plating layer is applied to the entire surface of the lead frame substrate 10 as an undercoat barrier plating for facilitating silver diffusion to solder.

In Embodied Example 4, up to formation of a lead frame shape (See FIGS. 3A-3E) through pretreatment for electroplating, steps were carried out substantially in the same manner as in Embodied Example 1. In the subsequent electroplating treatment, by use of a silver plating bath composed of a cyan-based silver plating solution, plating was performed for 60 seconds at a current density of 3 A/dm², to form a silver plating layer as a smooth undercoat having a thickness of about 1.1 μm. Then, by use of a silver plating bath with a silver concentration of 3.5 g/L, which was composed of a methanesulfonic acid-based silver plating solution, plating was performed for 15 seconds at a temperature of 60° C. and at a current density of 5 A/dm², to form a roughened silver plating layer 11 with a thickness of about 0.6 μm (See FIG. 3F) having acicular projections and having values shown in Table 1 regarding surface area ratio (i.e. the ratio of the surface area of the roughened silver plating layer to the surface area of a corresponding smooth surface), proportions of crystal directions <001>, <111> and <101>, and crystal grain diameter (average value), and thereby a lead frame 1 of Embodied Example 4 was completed.

Embodied Example 5

A lead frame of Embodied Example 5 is an exemplary lead frame having a structure in which, in consideration of electrical connection to a semiconductor element being made via solder as in the lead frame of Embodied Example 4, a nickel plating layer, a palladium plating layer and a gold plating layer are made to laminate the entire surface of the lead frame substrate 10 as undercoat barrier plating layers for preventing diffusion of copper residing in the lead frame substrate 10.

In Embodied Example 5, up to formation of a palladium plating layer in electroplating treatment, steps were carried out in substantially the same manner as in Embodied Example 3. Then, by use of a gold plating bath composed of a cyan-based gold plating solution, plating was performed for 10 seconds at a current density of 2 A/dm², to form a gold plating layer as a smooth undercoat having a thickness of about 0.001 μm. Then, by use of a silver plating bath with a silver concentration of 3.5 g/L, which was composed of a melthanesulfonic acid-based silver plating solution, plating was performed for 15 seconds at a temperature of 60° C. and at a current density of 5 A/dm², to form a roughened silver plating layer 11 with a thickness of about 0.5 μm (See FIG. 3F) having acicular projections and having values shown in Table 1 regarding surface area ratio (i.e. the ratio of the surface area of the roughened silver plating layer to the surface area of a corresponding smooth surface), proportions of crystal directions <001>, <111> and <101>, and crystal grain diameter (average value), and thereby a lead frame 1 of Embodied Example 5 was completed.

Comparative Example 1

A lead frame of Comparative Example 1 is an exemplary lead frame in which a smooth silver plating layer is formed directly on the entire surface of a lead frame substrate without an undercoat layer between.

In Comparative Example 1, up to formation of a lead frame shape through pretreatment for electroplating, steps were carried out substantially in the same manner as in Embodied Example 1. In the subsequent electroplating treatment, by use of a silver plating bath with a silver concentration of 65 g/L, which was composed of a cyan-based silver plating solution, plating was performed for 3 minutes at a current density of 3 A/dm², to form a silver plating layer with a thickness of 2.5 μm and having a smooth surface, and thereby a lead frame of Comparative Example 1 was completed.

Comparative Example 2

A lead frame of Comparative Example 2 is an exemplary lead frame in which a silver plating layer having a roughened surface with unevenness expressed by a surface area ratio (i.e. the ratio of the surface area of the roughened silver plating layer to the surface area of a corresponding smooth surface) of less than 1.30 is formed on the entire surface of a lead frame substrate.

In Comparative Example 2, up to formation of a lead frame shape through pretreatment for electroplating, steps were carried out substantially in the same manner as in Embodied Example 1. In the subsequent electroplating treatment, by use of a silver plating bath with a silver concentration of 65 g/L, which was composed of a cyan-based silver plating solution, plating was performed for 6 minutes at a current density of 3 A/dm², to form a silver plating layer with a thickness of 5.0 μm and having a smooth surface. Then, the surface of the silver plating layer was subjected to microetching treatment for 2 minutes by use of a stripping solution for silver plating, to form a roughened face with unevenness on the surface of the silver plating layer, and thereby a lead frame of Comparative Example 2 was completed. The silver plating layer given the roughened face with unevenness had a thickness of 2.8 μm, which was about half the thickness of the silver plating layer having the smooth surface.

Comparative Example 3

The lead frame of Comparative Example 3 is an exemplary lead frame in which an undercoat layer having a roughened surface is formed on the entire surface of a lead frame substrate, and a silver plating layer is formed thereon.

In Comparative Example 3, up to formation of a lead frame shape through pretreatment for electroplating, steps were carried out substantially in the same manner as in Embodied Example 1. In the subsequent electroplating treatment, first, by use of a nickel plating bath composed of nickel sulfamate, nickel chloride and boric acid, plating was performed for 7 minutes and 30 seconds at a current density of 2 A/dm$^2$, to form a nickel plating layer with a thickness of about 5.0 μm and a smooth surface. Then, the surface of the nickel plating layer was subjected to microetching treatment for 2 minutes by use of a stripping solution for nickel plating, to form a roughened face with unevenness on the surface of the nickel plating layer. The nickel plating layer given the roughened face with unevenness had a thickness of 2.6 μm, which was about half the thickness of the nickel plating layer having the smooth surface. Then, by use of a silver plating bath with a silver concentration of 65 g/L, which was composed of a cyan-based silver plating solution, plating was performed for 1 minute and 30 seconds at a current density of 3 A/dm$^2$, to form, as following the surface shape of the underlying nickel plating layer, a silver plating layer with a thickness of 1.5 μm and a roughened surface with unevenness having values shown in Table 1 regarding surface area ratio (i.e. the ratio of the surface area of the roughened silver plating layer to the surface area of a corresponding smooth surface), proportions of crystal directions <001>, <111> and <101>, and crystal grain diameter (average value). In this way, a lead frame of Comparative Example 3 was completed.

The plating composition requirements (type and thickness of plating layers, surface area ratio (i.e. ratio of surface area of (roughened or smooth) silver plating layer to surface area of corresponding smooth surface), proportions of crystal directions in the silver plating layer, and crystal grain size (average value)) for each of the lead frames of Embodied Examples 1 to 5 and Comparative Examples 1 to 3 are shown in Table 1.

It is noted that the field of view observed at 10,000× through a scanning electron microscope (SEM: Scanning Electron Microscope) was analyzed by an electron backscatter diffraction analyzer (EBSD: Electron Backscatter Diffraction) so that the proportions of crystal directions were calculated upon allowable angles for the respective directions being set to 15°. Further, a diameter of a crystal grain was defined as a diameter of a circle with an area equivalent to that of the crystal grain, which was defined by a grain boundary where the direction difference was 15° or more.

The plating thickness of a silver plating layer was measured by an X-ray fluorescence analyzer (SFT3300 manufactured by SII), and the plating thickness of a plating layer using nickel/palladium/gold plating was measured by an X-ray fluorescence analyzer (SFT3300 manufactured by SII).

The surface area ratio was measured by use of a 3D laser microscope (OLS4100 manufactured by OLYMPUS).

TABLE 1

| Example | Surface Morphology | Barrier Plating Layer Thickness (μm) | | | | Outermost Ag Plating Layer | | | | | | |
|---|---|---|---|---|---|---|---|---|---|---|---|---|
| | | Ag | Ni | Pd | Au | Surface Morphology | Thickness (μm) | Surface Area Ratio | Proportion of Crystal Direction | | | Crystal Grain Diameter (μm) |
| | | | | | | | | | <001> | <111> | <101> | |
| Embodied Example 1 | — | — | — | — | — | Acicular Projections | 1.5 | 3.1 | 8.7 | 16.3 | 23.6 | 0.1818 |
| Embodied Example 2 | Smooth | — | 1.0 | — | — | Acicular Projections | 0.5 | 3.0 | 9.2 | 16.1 | 22.7 | 0.1935 |
| Embodied Example 3 | Smooth | — | 1.0 | 0.01 | — | Acicular Projections | 0.6 | 3.1 | 8.8 | 15.9 | 23.2 | 0.2037 |
| Embodied Example 4 | Smooth | 1.1 | — | — | — | Acicular Projections | 0.6 | 2.9 | 9.0 | 15.8 | 22.8 | 0.1865 |
| Embodied Example 5 | Smooth | — | 1.0 | 0.01 | 0.001 | Acicular Projections | 0.5 | 3.1 | 8.6 | 16.3 | 23.0 | 0.1903 |
| Comparative Example 1 | — | — | — | — | — | Smooth | 2.5 | 1.1 | 23.4 | 12.3 | 6.3 | 0.3058 |
| Comparative Example 2 | — | — | — | — | — | Unevenness by Etching | 2.8 | 1.3 | 22.6 | 14.2 | 7.2 | 0.3268 |
| Comparative Example 3 | Unevenness by Etching | — | 2.6 | — | — | Unevenness following Ni Layer | 1.5 | 1.3 | 22.9 | 13.8 | 7.0 | 0.3120 |

Evaluation of Resin Adhesiveness

A cylindrical resin mold of 02 mm for evaluation purpose was formed on the roughened silver plating layer (the smooth silver plating layer in the case of Comparative Example 1) of each of the completed lead frames of Embodied Examples 1 to 5 and Comparative Examples 1 to 3. The shear strength of this resin was measured with a bond tester Dage Series 4000 (manufactured by Dage Corporation), to evaluate resin adhesiveness.

The evaluation results of resin adhesiveness of Embodied Examples 1 to 5 and Comparative Examples 1 to 3 are shown in Table 2.

TABLE 2

| Examples | Adhesion Strength | Process Time (Set to 100 for Comparative Example 1) | Amount of Ag Use (Set to 100 for Comparative Example 1) |
|---|---|---|---|
| Embodied Example 1 | 15 | 25 | 60 |
| Embodied Example 2 | 15 | 50 | 20 |
| Embodied Example 3 | 15 | 50 | 20 |
| Embodied Example 4 | 15 | 30 | 60 |
| Embodied Example 5 | 15 | 50 | 20 |
| Comparative Example 1 | 10 | 100 | 100 |
| Comparative | 11 | 200 | 200 |

TABLE 2-continued

| Examples | Adhesion Strength | Process Time (Set to 100 for Comparative Example 1) | Amount of Ag Use (Set to 100 for Comparative Example 1) |
|---|---|---|---|
| Example 2 Comparative Example 3 | 12 | 250 | 60 |

The lead frame of Comparative Example 1, with a shear strength of 10 MPa, was observed hardly to have a sufficient resin adhesiveness for practical use.

In contrast, as shown in Table 2, each of the lead frames of Embodied Examples 1 to 5 had a shear strength 1.5 times the shear strength of the lead frame of Comparative Example 1, and was observed to have a remarkably improved resin adhesiveness.

On the other hand, although each of the lead frames of Comparative Examples 2 and 3 had an improved resin adhesiveness with a shear strength higher than the lead frame of Comparative Example 1, it was only 1.1 times as high as the lead frame of Comparative Example 1 and failed to achieve a remarkable effect of improved resin adhesiveness as in the lead frames of Embodied Examples 1 to 5.

Evaluation of Productivity

Comparison was made regarding the processing time and the amount of silver plating required to form the surface morphology of the outermost plating layer in each of the lead frames of Embodied Examples 1 to 5 and Comparative Examples 2 and 3 into the form of a plating layer having a roughened surface, to evaluate productivity. In evaluation of productivity, upon the processing time and the amount of use of silver plating for the lead frame of Comparative Example 1, in which a smooth silver plating layer was formed as the outermost layer, being set to 100, respectively, relative numerical values were used as evaluation values. In addition, since a lead frame should be subjected to plating process while being line-conveyed, the evaluation value of the processing time was calculated on the basis of the time required for forming a metal plating layer that required the longest plating time in the plating process for the lead frame of each of Embodied Examples and Comparative Examples (Embodied Example 1: roughened silver plating, Embodied Examples 2, 3, and 5: smooth nickel plating, Embodied Example 4: smooth silver plating, Comparative Example 2: smooth silver plating, and Comparative Example 3: smooth nickel plating).

The evaluation results of productivity (the processing time and the amount of silver plating required to form the surface morphology of the outermost plating layer into the form having a roughened surface) of Embodied Examples 1 to 5 and Comparative Examples 2 and 3 are shown in Table 2.

The lead frame of Comparative Example 2 is an example in which, after formation of a silver plating layer with a smooth surface and a thickness of about 5.0 μm, a roughened, uneven surface was formed at the surface of the silver plating layer by microetching treatment with use of a silver plating stripping solution. The thickness of the silver plating layer with a roughened, uneven surface was 2.8 μm, which is about half the thickness of the silver plating layer with a smooth surface. As shown in Table 2, with the processing time being 200 and the amount of silver use being 200, the productivity was observed to be poor because of, in addition to the long processing time, a very high cost of silver, which is expensive.

The lead frame of Comparative Example 3 is an example in which, after formation of a nickel plating layer with a smooth surface and a thickness of about 5.0 μm, a roughened, uneven surface was formed at the surface of the silver plating layer by microetching treatment with use of a nickel plating stripping solution. The thickness of the nickel plating layer with a roughened, uneven surface was 2.6 μm, which is about half the thickness of the nickel plating layer with a smooth surface. As shown in Table 2, with the processing time being 250 and the amount of silver use being 60, it was observed that, although the cost of silver could be saved to some extent, the productivity was very poor because of the very long processing time.

On the other hand, as shown in Table 2, for every one of the lead frames of Embodied Examples 1 to 5, the processing time was 25 to 50 and the amount of silver use was 20 to 60. The productivity was observed to be remarkably improved with the processing time being reduced by 75 to 87.5% and the amount of silver use being reduced by 70 to 90% as compared with the lead frame of Comparative Example 2.

In addition, the lead frames of Embodied Examples 2, 3, and 5 were observed to achieve remarkably improved productivity with the processing time being reduced by 80% and the amount of silver use being reduced by 67% as compared with the lead frame of Comparative Example 3. Regarding the lead frames of Embodied Examples 1 and 4, although the amount of silver use was about the same as the lead frame of Comparative Example 3, it was significantly reduced as compared with the lead frame of Comparative Example 2. In addition, the processing time was reduced by 88 to 90% as compared with the lead frame of Comparative Example 3. In this way, the lead frames of Embodied Examples 1 and 4 were observed to achieve remarkably improved productivity.

Although the preferred embodiment modes and the embodied examples of the present invention have been described in detail above, the present invention is not limited to the embodiment modes and the embodied examples described above. Various modifications and substitutions may be made to the embodiment modes and the embodied examples described above without departing from the scope of the present invention.

The description has been made that, in the lead frame of the present invention, the material of the lead frame substrate is a copper-based material such as a copper alloy. However, a nickel-based alloy also may be applied as the material of the lead frame substrate.

Further, in the lead frame of the present invention, as long as its thickness does not impair the surface area ratio and the crystal structure of the roughened surface having acicular projections, a silver plating layer or a plating layer combining nickel, palladium, and gold may be made to laminate, as a plating layer for cover, the roughened silver plating layer having acicular projections provided as the outermost layer.

What is claimed is:

1. A lead frame comprising:
   a lead frame substrate made of a copper-based material; and
   a roughened silver plating layer having acicular projections, provided as an outermost plating layer and covering an entire surface of the lead frame substrate,
   wherein the roughened silver plating layer has a crystal structure in which the crystal direction <101> occupies a largest proportion among the crystal directions <001>, <111> and <101>, and wherein the acicular projections included in the roughened silver plating layer have a surface area ratio, which is a ratio of a surface area of the roughened silver plating layer to a surface area of a corresponding smooth surface, of 1.30 or more and 6.00 or less.

2. The lead frame according to claim 1, wherein an average crystal grain diameter of the roughened silver plating layer is smaller than 0.28 µm.

3. The lead frame according to claim 1, wherein an undercoat layer is provided between the lead frame substrate and the roughened silver plating layer.

4. The lead frame according to claim 2, wherein an undercoat layer is provided between the lead frame substrate and the roughened silver plating layer.

\* \* \* \* \*